(12) United States Patent
Madou et al.

(10) Patent No.: US 7,534,470 B2
(45) Date of Patent: May 19, 2009

(54) SURFACE AND COMPOSITION ENHANCEMENTS TO HIGH ASPECT RATIO C-MEMS

(75) Inventors: Marc J. Madou, Irvine, CA (US); Chunlei Wang, Irvine, CA (US); Lili Taherabadi, Irvine, CA (US); Benjamin Park, Irvine, CA (US); Rabih Zaouk, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 769 days.

(21) Appl. No.: 11/090,918

(22) Filed: Mar. 25, 2005

(65) Prior Publication Data

US 2006/0068107 A1    Mar. 30, 2006

Related U.S. Application Data

(60) Provisional application No. 60/615,088, filed on Oct. 1, 2004, provisional application No. 60/615,311, filed on Sep. 30, 2004.

(51) Int. Cl.
*C23C 6/00* (2006.01)

(52) U.S. Cl. ............... 427/249.1; 977/844; 977/947

(58) Field of Classification Search ............ 423/447.1, 423/447.3; 977/844, 947; 427/228, 249.1, 427/122, 535, 58, 539
See application file for complete search history.

(56) References Cited

U.S. PATENT DOCUMENTS

| | | | |
|---|---|---|---|
| 4,465,576 A | 8/1984 | Negishi | |
| 5,874,166 A | 2/1999 | Chu | |
| 6,143,412 A | 11/2000 | Schueller | |
| 6,445,006 B1 | 9/2002 | Brandes | |
| 6,495,258 B1 | 12/2002 | Chen | |
| 2002/0185951 A1* | 12/2002 | Russ et al. | 313/310 |
| 2004/0058517 A1* | 3/2004 | Nallan et al. | 438/585 |
| 2004/0075379 A1* | 4/2004 | Jin | 313/495 |
| 2004/0082247 A1 | 4/2004 | Dasai | |
| 2004/0158051 A1 | 8/2004 | Ozkan et al. | |
| 2006/0007983 A1* | 1/2006 | Tai et al. | 374/121 |
| 2006/0172189 A1* | 8/2006 | Kolodner et al. | 429/129 |

OTHER PUBLICATIONS

K. Kinoshita et al, Journal of Power Sources 81,-82,(1999)170-175.*

(Continued)

*Primary Examiner*—Michael Cleveland
*Assistant Examiner*—Tabassom Tadayyon Eslami
(74) *Attorney, Agent, or Firm*—Orrick, Herrington & Sutcliffe LLP

(57) ABSTRACT

C-MEMS architecture having carbon structures with high surface areas due to high aspect ratios and nanoscale surface enhancements, and improved systems and methods for producing such structures are provided. Specifically, high aspect ratio carbon structures are microfabricated by pyrolyzing a patterned carbon precursor polymer. Pyrolysing the polymer preferably comprises a multi-step process in an atmosphere of inert and forming gas at high temperatures that trail the glass transition temperature (Tg) for the polymer. The surface area of the carbon microstructures is increases by nanotexturing the surface through oxygen plasma exposure, and by integrating nanoscale structures with the carbon microstructures by exposing the carbon microstructures and a catalyst to hydrocarbon gas. In a preferred embodiment, the carbon microstructures are the source of carbon gas.

7 Claims, 9 Drawing Sheets

OTHER PUBLICATIONS

S. Ranganathan et al., Journal of the Electrochemical Society, 147(1) 277-282(2000).*

Lance D. Delzeit, patterned Growth of Carbon Nanotubes or Nanofibers, Jul. 2004.*

Chris Bower et al, "Applied Physics Letters", 77(2000)830-832.*

Kinoshita et al "Development of a Carbon-Based Lithium Microbattery" Journal of Power Sources 81-82, 1999, pp. 170-175.

Ranganathan et al "Photoresist-Derived Carbon for Microelectromechanical Systems and Electrochemical Applications" Journal of the Electrochemical Society 147 (1), 2000, pp. 277-282.

Kostecki et al "Fabrication of Interdigitated Carbon Structures by Laser Pyrolysis of Photoresist" Electrochemical and Solid-State Letters 5 (6), 2002, pp. E29-E31.

Sumio Iijima, "Helical Microtules of Graphitic Carbon", Nature, vol. 354, pp. 56-58 (Nov. 7, 1991).

Hongjie Dai, "Nanotube Growth and Characterization", Carbon Nanotubes, Topics Appl. Phys. 80, pp. 29-53 (2001).

Sumio Iijima et al., "Single-shell Carbon Nanotubes of 1-mm Diameter", Nature, vol. 363, pp. 603-605 (Jun. 17, 1993).

Delzeit et al., "*Multiwalled Carbon Nanotubes by Chemical Vapor Deposition Using Multilayered Metal Catalysts*", J. Phys. Chem. B 106, (2003) pp. 5629-5635.

Iijima et al., "*Single-shell carbon nanotubes of 1-nm diameter*", Nature, vol. 363, (Jun. 17, 1993), pp. 603-605.

Dai, "*Nanotube Growth and Characterization*", Topics Appl. Phys. 80 (2001) pp. 29-53.

Kim et al., "*Electrochemical Studies of Carbon Films from Pyrolyzed Photoresist*", J. Electrochem. Socl., vol. 145, No. 7 (Jul. 1998), pp. 2314-2319.

Iijimia, "*Helical microtubles of graphitic carbonl*", Nature, vol. 354, (Nov. 7, 1991), pp. 56-58.

* cited by examiner

Step 1 (Post Forming)

Step 2 (Pyrolysis)

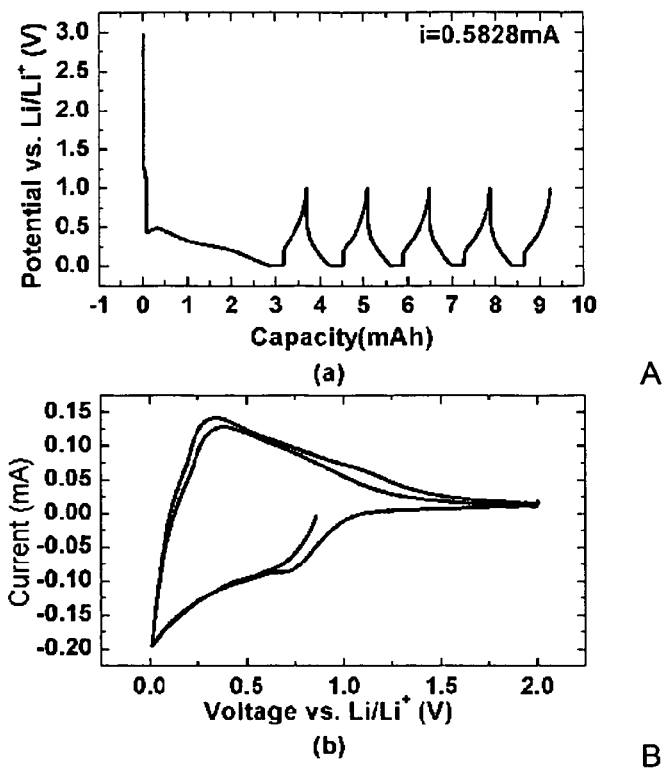
Fig. 5
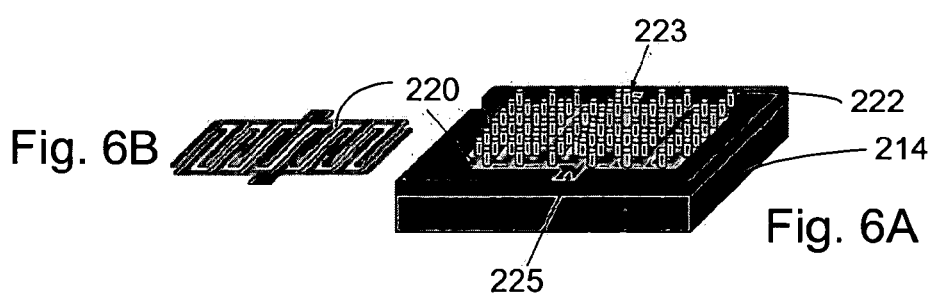

Step 1
(Post Forming)

Step 2
(Pyrolysis)

Step 3
(Nanotexturing)

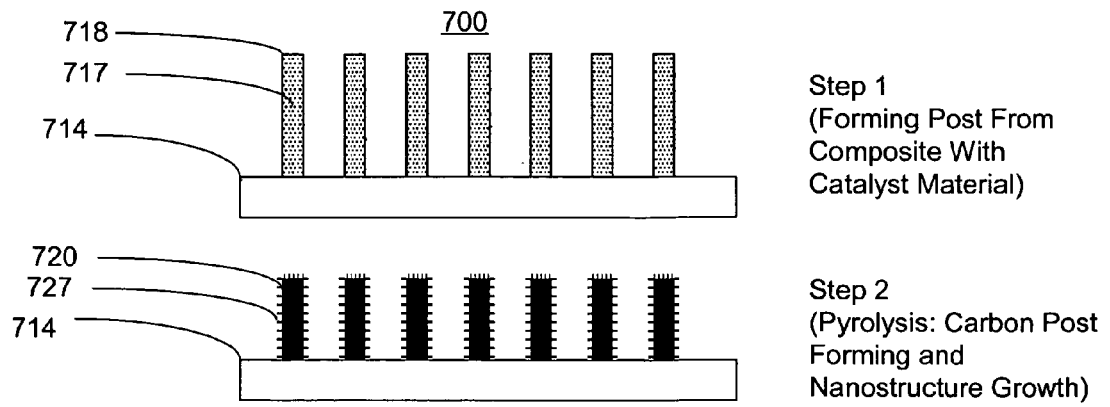
Step 1
(Forming Post From Composite With Catalyst Material)
Step 2
(Pyrolysis: Carbon Post Forming and Nanostructure Growth)
Fig. 16
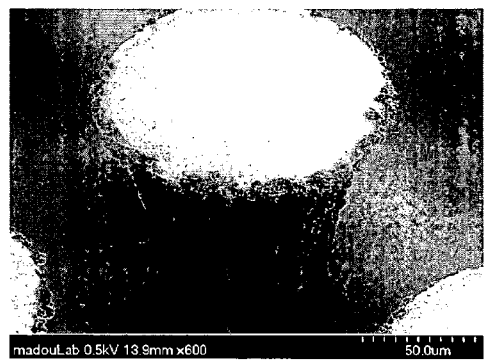
Fig. 17
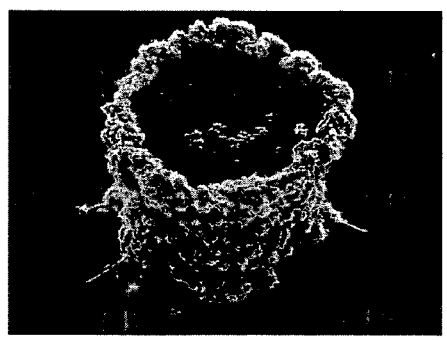 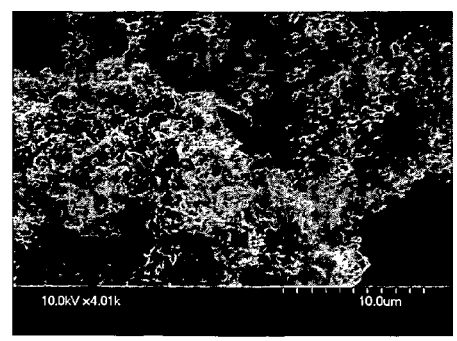
FIG. 18A  FIG. 18B

SURFACE AND COMPOSITION ENHANCEMENTS TO HIGH ASPECT RATIO C-MEMS

CROSS-REFERENCE TO RELATED APPLICATIONS

This application claims the benefit of U.S. Provisional Application Nos. 60/615,311 filed Sep. 30, 2004, and 60/615,088 filed Oct. 1, 2004, which are fully incorporated by reference herein.

FIELD OF THE INVENTION

The present invention relates to carbon micro-structures and, more particularly, to carbon micro-electro-mechanical-systems (C-MEMS) having carbon structures with high surface areas due to high aspect ratios and surface enhancements, and systems and methods for producing such structures.

BACKGROUND OF THE INVENTION

Recent attention has focused on carbon micro-electro-mechanical-systems (C-MEMS). Yet, microfabrication of C-MEMS carbon structures using current processing technology, including focus ion beam (FIB) and reactive ion etching (RIE), tends to be time consuming and expensive. Low feature resolution, and poor repeatability of the carbon composition as well as the widely varying properties of the resulting devices limits the application of screen printing of commercial carbon inks for C-MEMS. One promising C-MEMS microfabrication technique, however, is based on the pyrolysis of photo patterned resists (photoresists) at different temperatures and different ambient atmospheres. The advantage of using photoresists as the starting material for the microfabrication of various carbon structures is that the photoresists can be very finely patterned by photolithography techniques and hence a wide variety of repeatable shapes are possible. Moreover different temperature treatments result in different resistivities and mechanical properties. Some important C-MEMS properties includes: the material has a very wide electrochemical stability window, it exhibits excellent biocompatibility, is low cost, is very reproducible, very fine geometries can be defined as opposed to the more traditionally used printing of carbon inks, a wide range of resistivities and mechanical properties can be obtained, and the surface of this very chemically inert material is easy to derivatize. The material has particular importance in bioMEMS applications including DNA arrays, glucose sensors, and micro batteries.

Most pyrolyzed photoresist structures described in the literature today concern carbon features derived from positive photoresist and are very low aspect ratio. The fabrication of high aspect ratio and dense C-MEMS patterns is a challenging problem because with increasing photoresist thickness, the requirements of any lithography process increase exponentially. Basically, it is very difficult to design a thick positive tone photoresist chemistry to achieve the necessary transparency and to achieve reasonable exposure doses while maintaining excellent sidewall angles. The LIGA process in which PMMA resist is exposed with an x-ray source is capable of structures of the order of 1 mm. However, this technique requires an expensive synchrotron source, hence the motivation for cheaper and easier processes.

In many applications where the carbon micro-structures act as transfer interfaces, e.g., electrodes for battery applications, graft sites for DNA immobilization, sensing electrodes for chemical sensors, and the like, recent attention has focused on methods to improve surface-to-volume ratios and, thus, increase capacity per footprint, by increasing the surface area of the carbon micro-structures. Recent attention has also been focused on methods to provide structures that can act as bridges between micro-scale and nano-scale electronics.

Accordingly, it would be desirable to provide C-MEMS with carbon micro-structures having high surface areas and integrated structures that act as bridges between micro-scale and nano-scale electronics, and to provide improved methods for producing such structures.

SUMMARY

The present invention provides an improved C-MEMS architecture having carbon structures with high aspect ratios and/or nanoscale surface enhancements, and improved systems and methods for producing such structures. In many applications where carbon micro-structures act as a transfer interface (e.g. electrodes for battery applications, graft sites for DNA immobilization, sensing electrodes for chemical sensors, etc.), high surface area is desirable. The high aspect ratios and nanoscale surface enhancements provided herein advantageously significantly increase the surface area of the carbon micro-structures.

In one embodiment, which is described below as an example only and not to limit the invention, the surface of carbon micro-structures is nanotextured to increase the surface area of the carbon micro-structures. Nanotexturing of the surface of the carbon micro-strutures can be accomplished through oxygen plasma exposure of the carbon micro-structures or carbon precursor polymer micro-structures prior to pyrolysis. The plasma roughens the surface of the microstructure, creating a pumice-like nanotextured surface.

In another embodiment, which is described below as an example only and not to limit the invention, carbon micro-structures can be covered with a rich coat of nanoscale structures such as nanotubes, nanowires, nanofibers and the like, that hugely increases the surface area of the micro-structures. For example, for Li ion microbattery application, integration of carbon nanotubes and Si nanowires on the C-MEMS electrodes will increase the electrode surface areas and, thus, the Li storage capacity and power density, and decrease battery charge/discharge rates.

The nanoscale structures can be formed on carbon micro-structures by depositing catalyst particles or patterning a catalyst film on the surface of the carbon micro-structures and growing nanofibers, nanotubes, nanowires and the like in a carbon gas (e.g., methane) atmosphere on the carbon micro-structures. Alternatively, nanoscale structures can be formed on carbon micro-structures by first depositing a catalyst on the surface of carbon precursor polymer micro-structures or forming the carbon precursor micro-structures from a carbon precursor polymer embedded with a catalyst, and then growing nanoscale structures via a localized chemical vapor deposition process that occurs while pyrolyzing the carbon micro-structures. As the carbon precursor pylomer is pyrolysed, carbon containing gases are released into the furnace atmosphere while transforming the polymer into carbon. At the same time, these carbon containing gases find their way to the catalyst material promoting growth of the nanostructures on the carbon micro-structures.

In addition to providing a huge surface area increase that is desirable in many applications, the integration of nanowires and nanotubes to C-MEMS structures advantageously provides an electric contact solution for carbon nanoelectronics.

C-MEMS with integrated nanowires/tubes can be an electrical bridge between micrometer or millimeter system and nanoscale eletronics such as carbon nanotubes based nanoelectronics. C-MEMS structures can be used as both support and electrical contact to nanoscale materials. Carbon-to-carbon contact is considered to be an ideal electrical contact with negligible contact resistance.

In another embodiment, which is described below as an example only and not to limit the invention, the carbon microstructures are high aspect ratio carbon posts having aspect ratios greater than 10:1. The high aspect ratio carbon posts are preferably microfabricated by pyrolyzing polymer posts patterned from a carbon precursor polymer. The pyrolysing step preferably comprises a multi-step pyrolysis process in an atmosphere of inert and forming gas at high temperatures that trail the glass transition temperature (Tg) for the polymer. Alternatively, the pryrolyzing step can comprise a slow continuous ramping of the furnace temperature such that the temperature always trails Tg. The patterning of the polymer posts preferably includes photopatterning single or multi-layers of photoresists—preferably negative photoresist.

Further systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims. It is also intended that the invention is not limited to the details of the example embodiments.

BRIEF DESCRIPTION OF THE DRAWINGS

The details of the invention, both as to its structure and operation, may be gleaned in part by study of the accompanying figures, in which like reference numerals refer to like parts. The components in the figures are not necessarily to scale, emphasis instead being placed upon illustrating the principles of the invention. Moreover, all illustrations are intended to convey concepts, where relative sizes, shapes and other detailed attributes may be illustrated schematically rather than literally or precisely.

FIGS. 5A and 5B are graphs illustrating (5A) the galvanostatic charge/discharge cycle behavior of patterned carbon arrays and (5B) the cyclic voltammetry of patterned carbon arrays.

FIGS. 6A and 6B are perspective views of (6A) an assembly of a C-MEMS based carbon electrode array and carbon current collector for use in an electrochemical systems such as 3D batteries and (6B) the C-MEMS based carbon current collector of the assembly.

FIG. 16 is a schematic showing the fabrication process for growing nanostructures from embedded catalysts on carbon micro-structures during a pyrolysis process.

FIG. 17 is a SEM photograph of an SU8 post doped with seed carbon nanofibers.

FIG. 18A is a SEM photograph of a nanofibrous C-MEMS post; 18B is a close up SEM photograph of the surface in FIG. 18A.

DESCRIPTION OF THE PREFERRED EMBODIMENT

Figure 1A:
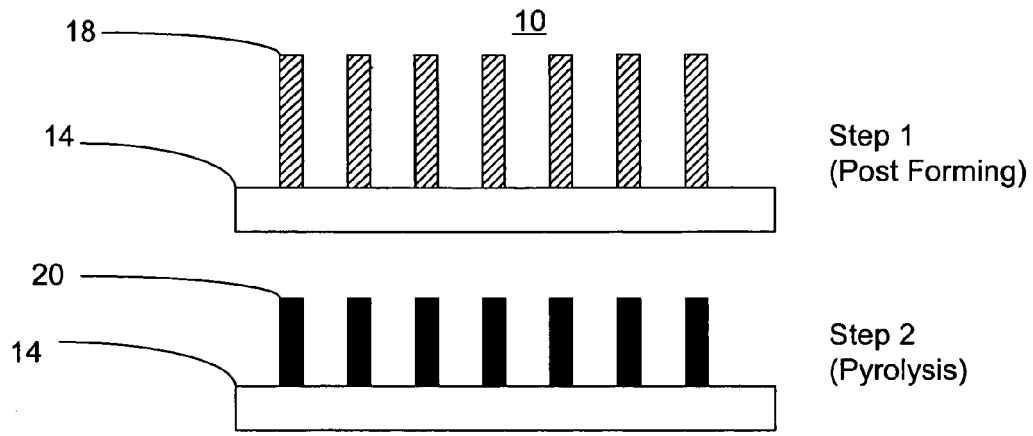
FIG. 1A is a schematic showing the fabrication process for producing high aspect ratio C-MEMS in accordance with one embodiment.
Figure 1B:
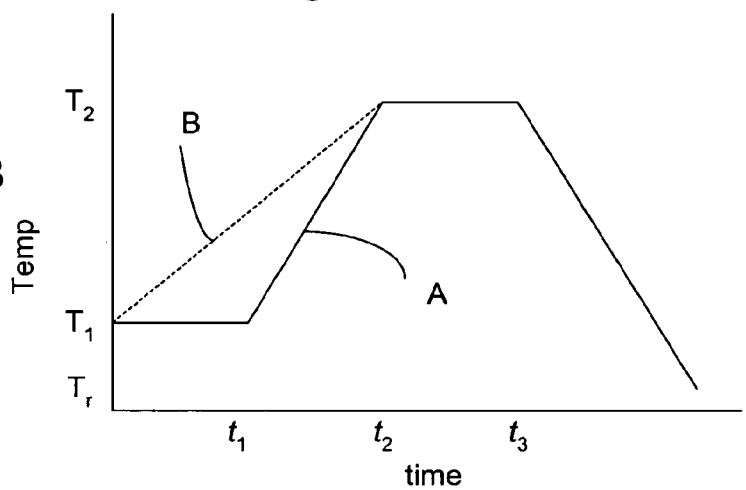
FIG. 1B is a graph showing the pyrolyzing of the fabrication process depicted in FIG. 1A.

Referring in detail to the figures, the systems and methods described herein facilitate the production of high aspect ratio carbon-micro-electro-mechanical systems (C-MEMS) structures, as well as C-MEMS structures with nanoscale surface enhancements thereto. In one embodiment, as depicted in FIGS. 1A and 1B, high aspect ratio carbon posts, having aspect ratios greater than 10:1, are microfabricated by pyrolyzing polymer posts patterned from a carbon precursor polymer. In step 1 of the process 10, polymer posts 18 are patterned or formed in an array on a substrate 14. The posts 18 can be formed by a variety of processes including, but not limited to, photolithography, soft lithography methods including stamping or micro contact printing, hot embossing or nanoimprinting, step and flash lithography, micro injection molding and the like, silk screening, spray deposition techniques including plasma spraying and the like, self-assembly of malleable polymers and liquids using electric fields, van der Waals forces and the like, x-ray patterning, and the like.

Figure 2:
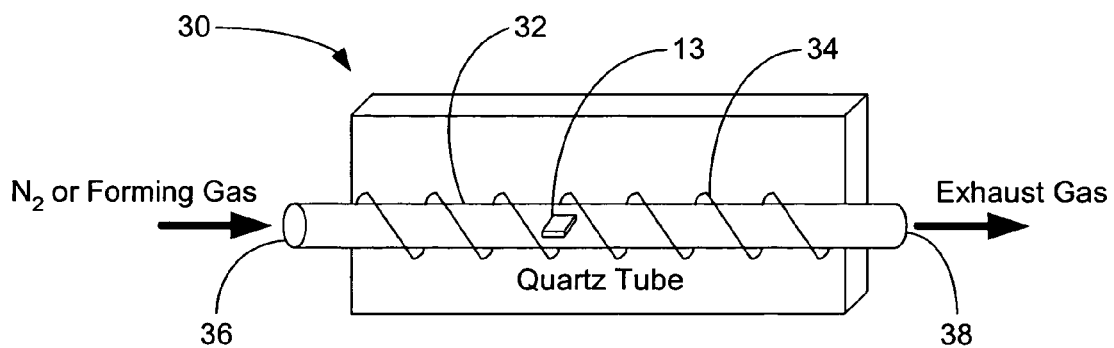
FIG. 2 is a schematic of a pyrolyzing furnace for use in step 2 of the process depicted in FIG. 1.

The pyrolyzing step (step 2) is preferably conducted, as depicted in FIG. 2, in an open ended quartz tube furnace 30. The furnace 30 includes an open ended quartz tube 32 with a heating element 34 coupled thereto. During the pyrolyzing process, a wafer or sample 13 with patterned precursor polymer posts is placed within the quartz tube 32. Inert gas, such as nitrogen ($N_2$), and forming gas, such as hydrogen (5%) and nitrogen ($H_2(5\%)/N_2$), enter the tube 32 at one end 36, while exhaust gas exits the tube 32 at the other end 38.

Referring to FIG. 1B, the pyrolysis process of step 2 preferably comprises a multi-step pyrolysis process conducted in an atmosphere of inert and forming gas at high temperatures that trail the glass transition temperature Tg of the polymer posts 18. As depicted by curve A, the wafer 13 is baked at a first temperature $T_1$ for a predetermined time $t_1$ in an inert atmosphere. The wafer 13 is then heated up to a second temperature $T_2$ in an inert atmosphere at a predetermined gas flow rate through the quartz tube 32. The temperature of the furnace 30 is preferably slowly ramped up from the first temperature $T_1$ to the second temperature $T_2$. A heating rate of preferably about 10° C./min has been used. When the furnace 30 reaches the second temperature $T_2$, the inert gas is shut off and forming gas is introduced at a predetermined gas flow rate for a predetermined time period $t_2$-$t_3$. At the end of this time period $t_3$, the heating element 34 is turned off and the wafer 13 is allowed to cool down in an inert atmosphere to room temperature $T_r$. The total cooling time is about 8-9 hours.

Alternatively, as depicted by curve B, the pyrolyzing step can comprise a slow continuous ramping of the furnace temperature from the first temperature $T_1$ to the second temperature $T_2$, wherein the heating temperature always trails the glass transition temperature Tg of the polymer posts 18. The sample 13 is heated in an inert atmosphere as the furnace temperature ramps up from $T_1$ to $T_2$. Once the furnace temperature reaches $T_2$, the pyrolysis process proceeds as detailed in regard to curve A. In a further alternative, the pyrolysis process can include multiple heating steps between temperatures $T_1$ and $T_2$ along curve A.

Figure 3:
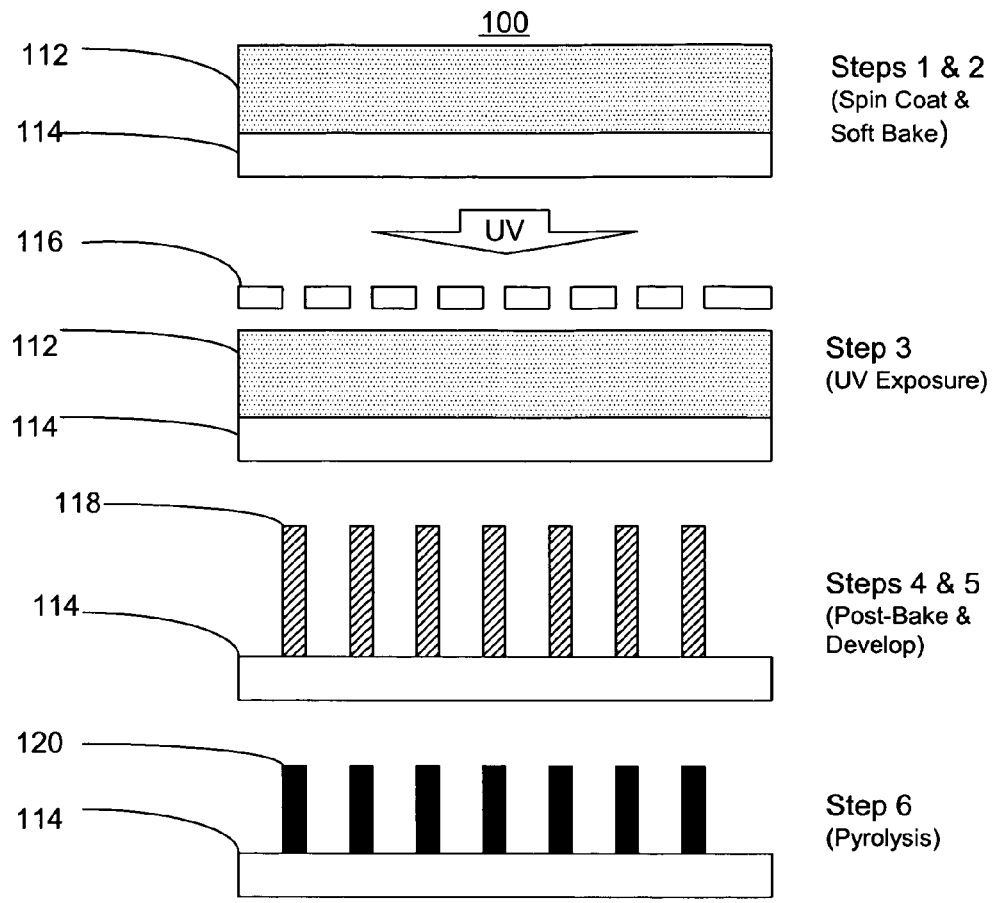
FIG. 3 is a schematic showing the fabrication process for producing high aspect ratio C-MEMS in accordance with another embodiment.

In a single step pyrolysis process with heating at high temperatures in a vacuum furnace, pyrolyzed polymer post patterns tend to peel from the substrate. In the multi-step process described above in which the pyrolysis process is conducted in inert and forming gas, this problem is resolved due to (I) the bake process at the first temperature, which cross-links the polymer better, enhancing adhesion of polymer to the substrate, (II) the multi-step heating process with its slow heating rate, which more effectively releases the stress from the adhesion of the polymer to the substrate which results in tensile stress in the carbon posts near the substrate interface, and (III) the slower de-gassing that occurs in a forming gas atmosphere. Heat-treatment during crosslinking generates gaseous by products and the subsequent out-gassing may cause the formation of micro-cracks which disintegrate the sample. In a vacuum, this outgassing would tend to be faster and thus more destructive Turning to FIG. 3, in an exemplary embodiment, high aspect ratio carbon posts (>10:1) are microfabricated by preferably pyrolyzing negative photoresist, such as SU 8 and the like, in a simple, one spin-coat step process. A photolithography process 100 for patterning negative photoresist preferably includes the following steps: step 1, spin coating a photoresist film 112 onto a substrate 114; step 2, soft baking the film 112; step 3, near UV exposure of the film 112 with a preferred mask 116; step 4, post baking the exposed film 112; and step 5, developing the exposed film 112 to form an array of posts 118. For example, a typical process for a 200 μm thick SU-8 photoresist film involves spinning at approximately 500 rpm for about 12 seconds then at approximately 1400 rpm for about 30 seconds (step 1), followed by a bake for about 10 minutes at about 65° C. and a bake for about 80 minutes at about 95° C. (step 2). Near UV exposure of the photoresist is then performed, e.g., in a Karl Suss MJB3 contact aligner for about 100 seconds (step 3). The post bake is then carried out for about 2 minutes at about 65° C. and for about 30 minutes at about 95° C. (step 4). Development is then carried out using a SU-8 developer such as a SU-8 developer from MicroChem (NANO™ SU-8 Developer) (step 5). For SU-8 100 photoresist modified with iron oxide particles, an over exposure process was introduced with exposure duration of as much as 5 minutes.

In the pyrolysis step, step 6, of the process 100, photoresist-derived C-MEMS architectures, i.e., carbon posts 120, are then obtained in accordance with the two- or multi-step pyrolysis process depicted and described in regard to FIG. 1B. For example, the pyrolysis process of step 6 is conducted in an open ended quartz-tube furnace, as depicted in FIG. 2, in which samples are preferably baked in an inert gas atmosphere, such as N2, at about 300° C. for about 30-40 minutes first, then heated up to about 900° C.-1000° C. in an inert gas atmosphere, such as N2, at about 2000 standard cubic centimeters per minute (sccm). At this point the N2 gas is shut off and forming gas, such as H2 (5%)/N2, is introduced at about 2000 sccm for about one hour. The heating element 34 on the furnace 30 is then turned off and the samples are cooled down again in N2 atmosphere to room temperature. A heating rate of preferably about 10° C./min has been used, and the total cooling time is about 8-9 hours.

Figure 4:
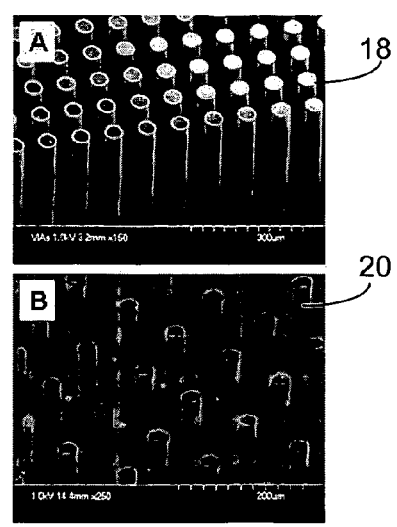
FIGS. 4A and 4B are SEM photographs of (4A) photoresist and (4B) carbon structures before and after pyrolysis that were produced in accordance with the process illustrated in FIG. 3.

FIGS. 4A and 4B are SEM photographs of SU-8 photoresist posts before pyrolysis and the resulting carbon structures after pyrolysis. As shown in FIG. 4A, a typical SU-8 array of posts on a substrate of Au/Ti/SiO$_2$/Si is uniform with straight walls and good edge profiles. The average height of the posts shown here is around 340 μm and the average thickness in the midsection of the posts (i.e., the rod diameter) is 50 μm. After pyrolysis the overall structure of the cylindrical posts is largely retained, as shown in FIG. 4B. The height to width (at midsection of the posts) ratio of the pyrolyzed material corresponds to an aspect ratio of 9.4:1. Ratios as high as 20:1, in a one-step spin coat process, and 40:1, in a two step spin coat process have been obtained. Aspect ratios greater than 40:1 are possible with a multi-step spin coat process. (see, e.g., FIGS. 7 through 11).

The pyrolyzed carbon posts produced in accordance with the process discussed above, were shown to exhibit reversible intercalation/de-intercalation of lithium. To confirm this feature, two different types of electrodes were studied. A first electrode was an unpatterned carbon film electrode, 1.6 mm thick, obtained from AZ 4620 photoresist on SiO$_2$/Si. The film electrode was designed to serve as a reference sample to determine whether pyrolyzed SU-8 exhibited electrochemically reversible intercalation/de-intercalation of lithium. The second electrode sample was a patterned electrode array obtained from SU-8 photoresist, consisting of 180×180 posts with a thickness of about 150 mm, on unpatterned carbon obtained from AZ 4620.

Electrochemical measurements were carried out using a 3-electrode Teflon cell that employed an o-ring seal to confine the working electrode to a surface area of about 6.4 cm$^2$ (circle of 2.86 cm diameter). In this way, the projected surface areas for both types of electrodes were identical. The carbon electrodes served as the working electrode while lithium ribbon (99.9% pure, Aldrich) was used as both the counter and reference electrode. The electrolyte was 1 M LiClO$_4$ in a 1:1 volume mixture of ethylene carbonate (EC) and dimethyl carbonate (DMC). All the cells were assembled and tested in an argon filled glove box in which both the oxygen and moisture levels were less than 1 ppm.

Galvanostatic and voltammetry experiments were carried out on both types of cells. For the galvanostatic measurements, the current was based on the C/5 rate for graphite (corresponding to 50 mA and 580 mA for unpatterned and patterned films, respectively) and cells were cycled between 10 mV and 1 V vs. Li/Li+. The voltammetry experiments were carried out using a sweep rate of 0.1 mV/s over the potential range 10 mV to 2V vs. Li/Li+. All the electrochemical measurements were performed with a computer-controlled Arbin multi-channel station. A Hitachi S-4700-2 field-emission scanning electron microscope (FESEM) was used to characterize the C-MEMS structures.

In the non-patterned film carbon electrodes, the electrochemical behavior is similar to that of coke electrodes with no evidence of staging plateaus and a sloping profile. The galvanostatic measurements of the unpatterned film electrode show a large irreversible capacity on the first discharge followed by good cycling behavior, which is also consistent with the behavior of coke. These results are best characterized by considering the surface area normalized lithium capacity, which is determined to be 0.070 mAh cm$^{-2}$ for the second and subsequent cycles. The gravimetric capacity can be estimated by knowing the film thickness and density. For a fully dense film, this corresponds to ~220 mAh g$^{-1}$, which is within the range of reversible capacities reported for coke.

The patterned carbon electrodes exhibit the same general electrochemical behavior. The voltammogram in FIG. 5B, for cycles two and three, is virtually identical to that of the unpatterned film electrode. The shoulder at 0.8 V is more pronounced but all other features are the same. Thus, there is no question that the C-MEMS electrode array is electrochemically reversible for lithium and that the characteristics of the pyrolyzed SU-8 array are similar to that of coke. The galvanostatic measurements in FIG. 5A were found to give a surface area normalized discharge capacity of 0.125 mA cm$^{-2}$ for the second and succeeding cycles. Thus, the C-MEMS electrode array possesses nearly 80% higher capacity than that of the unpatterned carbon film, for the same defined working electrode area of 6.4 cm$^2$. The reason for the greater capacity arises from the additional active area of the posts. The C-MEMS array has a higher internal resistance leading to a significant overpotential, which can be seen in the voltage steps at the beginning of each charge/discharge. This higher resistance arises from the fact that the height of the posts is nearly two orders of magnitude larger than the thickness of the unpatterned film. By applying smaller currents, the overpotential can be reduced significantly and the capacity increases.

As such, the C-MEMS architecture, i.e., high aspect ratio C-MEMS carbon electrode arrays, produced in accordance with the process described herein, constitute a powerful approach to building 3D carbon microelectrode arrays. Because these C-MEMS array electrodes exhibit reversible intercalation/de-intercalation of lithium, they can be used for microbattery applications. Such arrays may be connected with C-MEMS leads and enable switching to high voltage or high current depending on the application at hand. As discussed in greater detail below, the process described herein can be used to fabricate both the current collector and the electrodes, which simplifies the architecture and design of electrochemical systems such as 3D batteries. As depicted in FIGS. 6A and 6B, C-MEMS carbon electrode arrays 222 and carbon current collector 220 with negative and positive contacts 223 and 225 are shown formed on top of a substrate 214.

Creating high-aspect-ratio C-MEMS structures from photoresist is challenging with a single exposure step due to the UV light not being able to reach the bottom of the structure during the exposure step. Also, the C-MEMS pyrolysis process makes fabricating interconnects for carbon electrodes difficult because a suitable conductive material must be able to survive the harsh temperature conditions of the C-MEMS pyrolysis process. However, forming high-aspect-ratio C-MEMS structures and connecting electrodes is easily accomplished by aligning multiple layers of C-MEMS structures. Specifically, photoresist can be patterned in layers creating multi-layer structures because a layer of photoresist can be applied on top of an existing layer of photoresist and then patterned using photolithography. Photopatterned/cross-linked SU-8 on the lower layers can go through multiple bake-exposure-development steps without damage. The multi-layer structures survive pyrolysis with only isotropic shrinkage, and retain good adhesion to the substrate.

Figure 7:
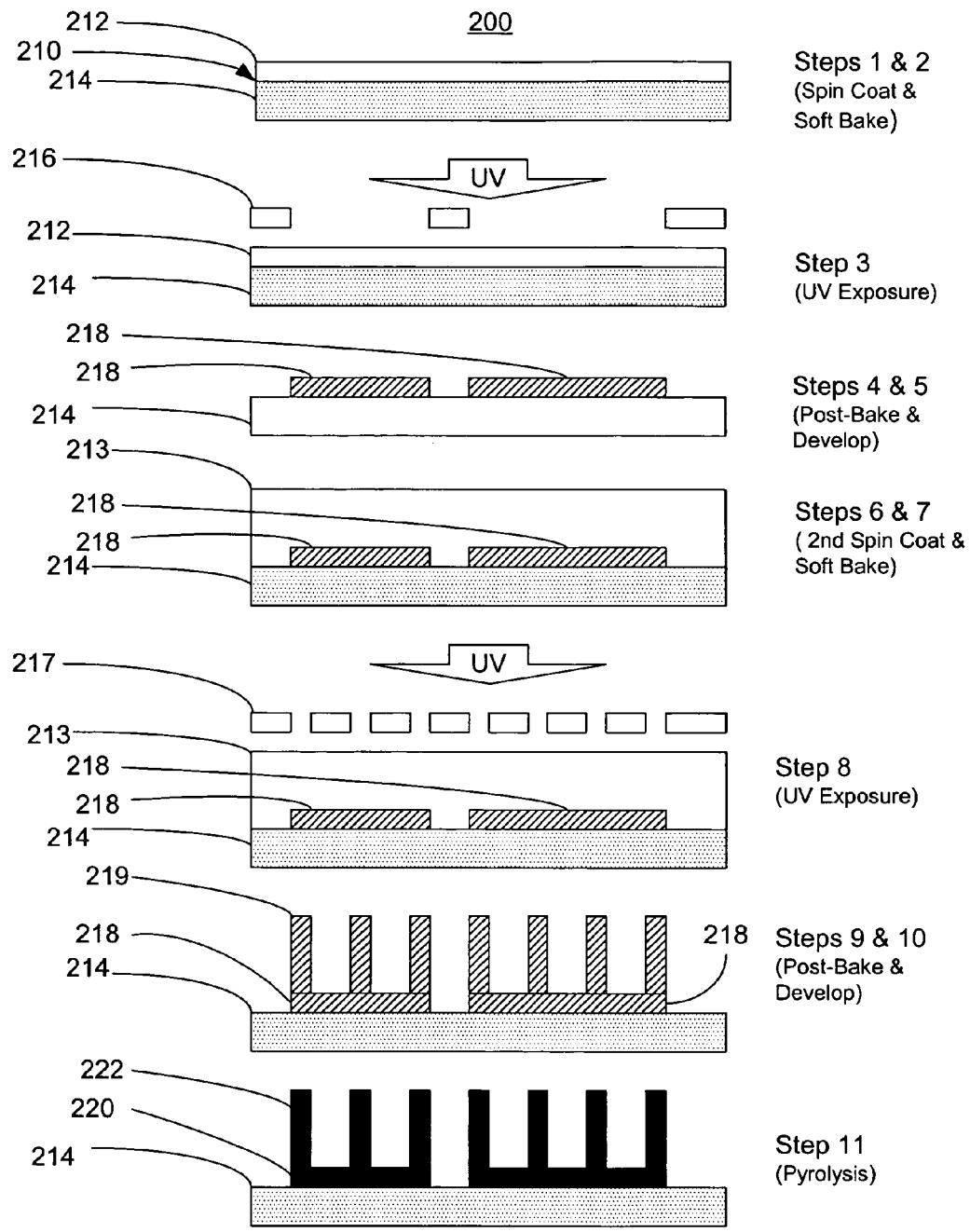
FIG. 7 is a schematic showing the fabrication process for producing multi-layer carbon structures comprising high aspect ratio C-MEMS posts and interconnects in accordance with another embodiment.

An embodiment of the process 200 to form high aspect ratio C-MEMS carbon electrodes 222 and carbon interconnects 220 is depicted in FIG. 7. At step 1, a first layer of negative photoresist 212, preferably SU-8, is spun onto a substrate 214, such as SiO$_2$(5000 Å)/Si, using a two-step spinning process. Table 1 shows the preferred lithography processing parameters for various thicknesses of SU-8.

TABLE 1

The lithography preferred processing parameters for various thickness of SU-8

| SU-8 Thickness (μm) | Resist Type | Spin speeds and times | | Soft bake | | Exposure dose (mW/cm$^2$) | Post exposure bake (PEB) | |
|---|---|---|---|---|---|---|---|---|
| | | Step 1 (12 sec.) | Step 2 (30 sec.) | 65° C. | 95° C. | | 65° C. | 95° C. |
| 25 | SU-8 25 | 500 | 2000 | 3 min | 10 min | 200 | 1 min | 3 min |
| 100 | SU-8 100 | 500 | 3000 | 10 min | 40 min | 400 | 1 min | 10 min |
| 200 | SU-8 100 | 500 | 1500 | 15 min | 90 min | 450 | 1 min | 30 min |

The wafer 210 is then soft baked at step 2 using a two step process in an oven or hot plate to remove solvents from the photoresist 212. The bake time depends on the thickness of SU-8 and is given for three different thicknesses in Table 1. After a relaxation time of at least about ten minutes, the SU-8 photoresist is exposed to UV light at step 3 in an aligner through a photo mask 216. The exposure dose is given in the Table 1. After exposure, the wafer is post exposure baked at step 4 using a two-step process. The post exposure bake (PEB) times are given in the Table 1. The PEB in step 4 allows the photoresist to harden. After another relaxation time of at least about ten minutes, the SU-8 is developed at step 5 in an SU-8 developer solution (usually PGMEA) until all unexposed SU-8 is removed and SU-8 interconnects 218 are formed. The next layer of SU-8 213 is spun on top of the existing layer 218 at step 6. The wafer 210 is then soft baked at step 7. After a relaxation time of at least about ten minutes, the SU-8 photoresist is exposed to UV light at step 8 in an aligner through a photo mask 217. After exposure, the wafer is PEB at step 9. After another relaxation time of at least about ten minutes, the SU-8 layer 213 is developed at step 10 in an SU-8 developer solution (usually PGMEA) until all unexposed SU-8 is removed and SU-8 posts 219 are formed.

The soft bake times, exposure doses and PEB times of this process 200, which are related to the SU-8 thickness, will be different for different thicknesses. Additionally, the development steps for each layer can be skipped, and the whole device can be developed in a single step.

After creating the multilayer SU-8 structure, it is pyrolyzed at step 11 in an open ended furnace under an inert atmosphere. A two step pyrolysis is performed at two different temperatures; first, the samples are hard-baked at 300° C. for about 30-40 minutes and then ramped up to about 900-1000° C. under an N2 atmosphere. The first 300° C. step preferably removes any remaining solvents and ensures more complete cross-linking of the SU-8. Samples are held at about 900-1000° C. for about 60 minutes under a forming gas, preferably 95% N2/5% H2. The samples are then cooled down in an N2 atmosphere to room temperature. Nitrogen and forming gas are set to flow at 2000 sccm during and after pyrolysis. The heating rate is preferably about 10° C./min and the total cooling time is about 8-9 hours.

Figure 9A:
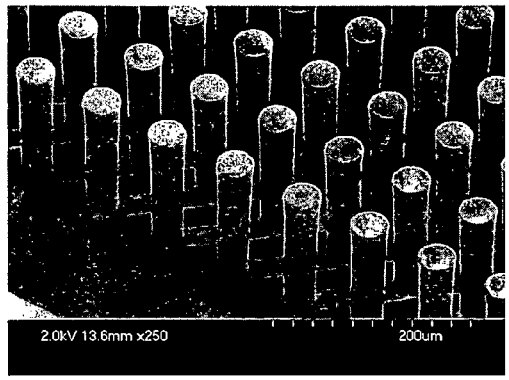
FIGS. 9A and 9B are SEM photos showing (9A) a close-up view and (9B) a low magnification of a two layer SU-8 structure. In this structure, the first layer was patterned to be an interconnect layer, and the second layer was patterned to be micro electrodes (posts).
Figure 9B:
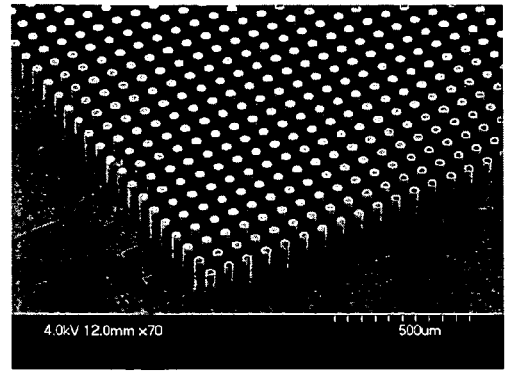
Figure 10A:
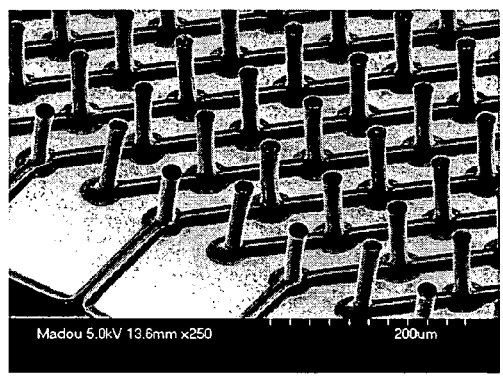
FIGS. 10A and 10B are SEM photos showing (10A) a close-up view and (10B) a low magnification view of two layer carbon structures corresponding to the structures in FIGS. 9A and 9B after pyrolysis.
Figure 10B:
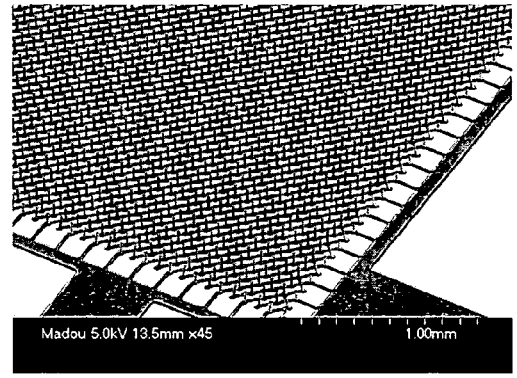

FIGS. 9A and 9B are SEM photos showing (9A) a close-up view and (9B) a low magnification of a two layer SU-8 structure. In this structure, the first layer was patterned to be an interconnect layer, and the second layer was patterned to be micro electrodes posts. FIGS. 10A and 10B are SEM photos showing (10A) a close-up view and (10B) a low magnification view of a two layer carbon structure corresponding to the structure shown in FIGS. 9A and 9B after pyrolysis.

Figure 8:
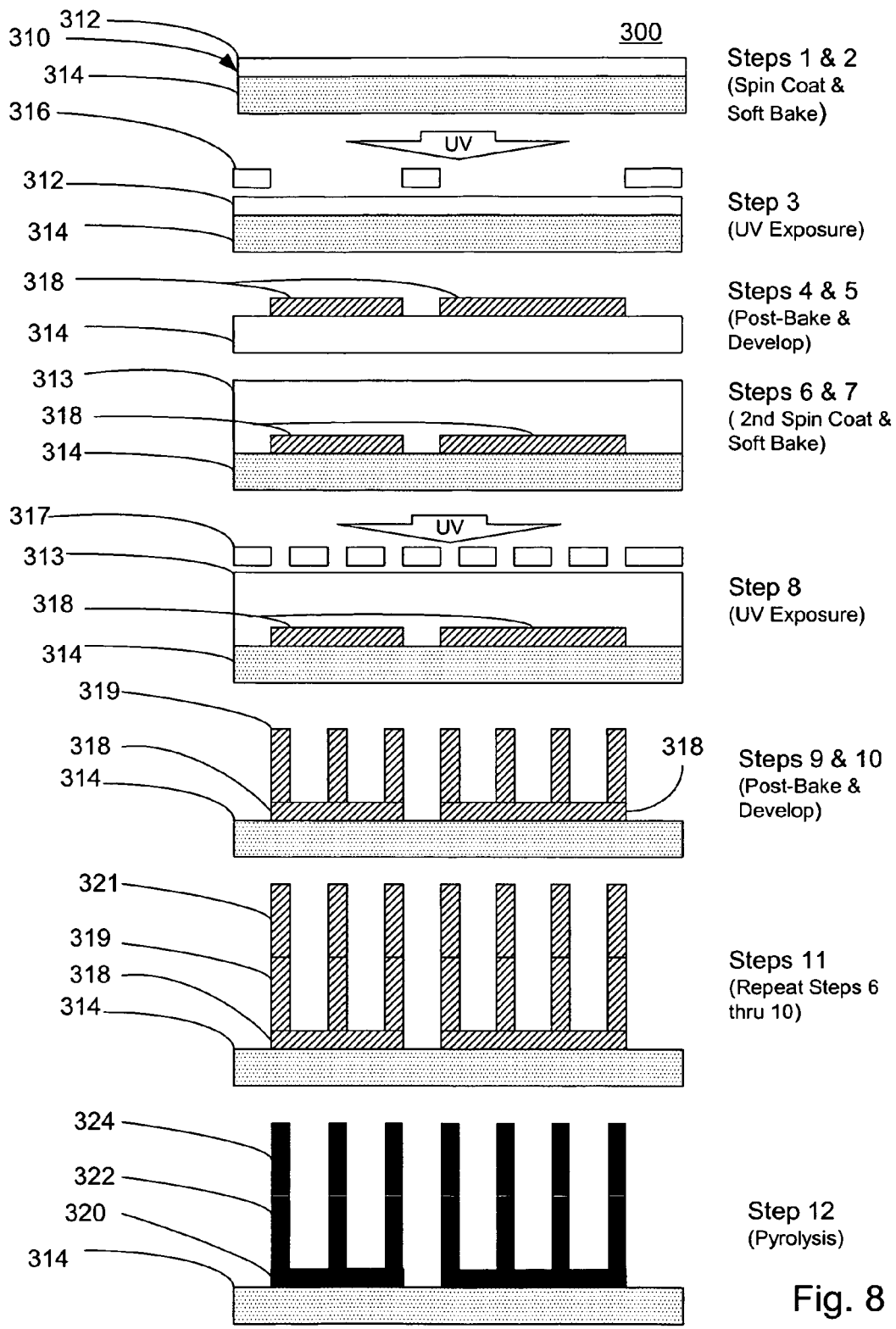
FIG. 8 is a schematic showing the fabrication process for producing multi-layer carbon structures comprising high aspect ratio C-MEMS posts and interconnects in accordance with another embodiment.

Referring to FIG. 8, an embodiment of a process 300 to form multi-layer high aspect ratio C-MEMS carbon electrodes 322 and 324 and carbon interconnects 320 is depicted. At step 1, a first layer of negative photoresist 312, preferably SU-8, is spun onto a substrate 314. The wafer 310 is then soft baked at step 2. After a relaxation time of at least about ten minutes, the SU-8 photoresist is exposed to UV light at step 3 in an aligner through a photo mask 316. After exposure, the wafer is post exposure baked at step 4 using a two-step process. The PEB in step 4 allows the photoresist to harden. After another relaxation time of at least about ten minutes, the SU-8 is developed at step 5 in an SU-8 developer solution (usually PGMEA) until all unexposed SU-8 is removed and SU-8 interconnects 318 are formed. The next layer of SU-8 313 is spun on top of the existing layer 318 at step 6. The wafer is then soft baked at step 7. After a relaxation time of at least about ten minutes, the SU-8 photoresist 313 is exposed to UV light at step 8 in an aligner through a photo mask 317. After exposure, the wafer was post exposure baked at step 9. After another relaxation time of at least about ten minutes, the SU-8 layer 313 is developed at step 10 in an SU-8 developer solution (usually PGMEA) until all unexposed SU-8 is removed and SU-8 posts 319 are formed. At step 11, steps 6 thru 10 are repeated to form a set of posts 321 aligned on top of the first set of posts 319.

Figure 11A:
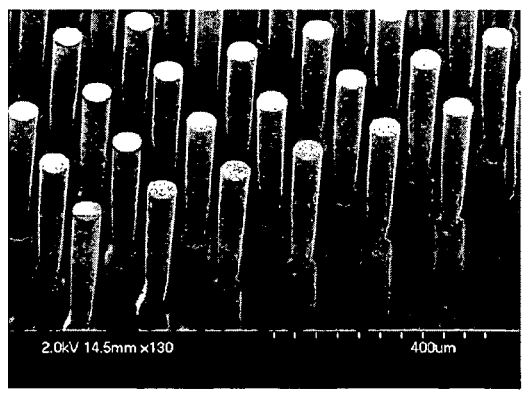
FIGS. 11A and 11B are SEM photos showing (11A) a three layer SU-8 structure with the first layer patterned to be an interconnect layer, and the second and third layers were patterned sequentially to achieve higher aspect ratio micro electrodes (posts) for use in microbattery experiments; and (11B) a three layer carbon structure corresponding to the structure in FIG. 11A after pyrolysis.
Figure 11B:
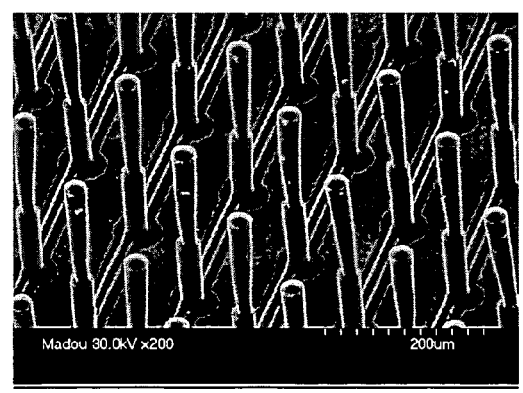

After creating the multilayer SU-8 structure, it is pyrolyzed at step 12 as described in regard to step 11 of FIG. 7 creating multi-layer high aspect ratio carbon electrode posts 322 and 324 aligned on top of one another and carbon interconnects 320. FIGS. 11A and 11B are SEM photos showing (11A) a three layer SU-8 structure with the first layer patterned to be an interconnect layer, and the second and third layers were patterned sequentially to achieve higher aspect ratio micro electrodes (posts) for use in microbattery applications and the like; and (11B) a three layer carbon structure corresponding to the structure shown in FIG. 11A after pyrolysis.

A disadvantage of using carbon interconnects is that carbon, although a great electrochemical material, is not an excellent electrical conductor. The main advantages of using metal interconnects with respect to other methods, e.g., using carbon interconnects, applying conductive pastes, physically contacting the carbon using metal wires and the like, are that the metal interconnects have a very high conductivity, especially when compared to using carbon interconnects. Metals such as silver, copper, or gold tend to be substantially less resistive than carbon material. Another advantage is that metal interconnects tend to be very robust, especially when compared to conductive pastes and physical contact.

The pyrolysis process can be harsh and, in some instances, cause the metal layer to melt resulting in beading or discontinuity in the metal layer. This problem is overcome by using refractory metals, carbon based metal alloys, and/or substrates with high surface energy.

In one embodiment, a process used to create high-conductivity interconnect traces to connect C-MEMS carbon structures includes depositing a metal layer, such as Ag, Au, Ni, Pt, Ti, and the like, on a substrate. The metal layer can be deposited using sputtering, evaporation, and other method of metal deposition. An adhesion layer, e.g., Cr or Ti for silicon substrates, can may be used to promote adhesion of the metal layer to the substrate. The metal is then patterned using a patterning method such as lift-off, etching, and the like, to pattern metal traces or interconnects. A polymer precursor is then patterned on top of the metal traces, and then pyrolyzed to create a C-MEMs electrode structure coupled to metal interconnects. The polymer precursor can be a negative photoresist such as SU-8 and the like, and can be patterned and then pyrolyzed in in accordance with the method depicted and described herein. High aspect ratio carbon structures can be microfabricted on top of these interconnects or alternatively on a carbon layer microfabricated on top of the interconnects. The layer can be pyrolyzed before or after the high aspect ratio structures have been patterned.

In a detailed example, Ni interconnects were formed by coating Ni onto a substrate. The process included the following steps: step 1, deposit 1000 Å Cr onto the substrate using a thermal evaporator; step 2, deposit 4000 Å Ni onto the Cr adhesion layer using a thermal evaporator; step 3, pattern the Ni and Cr layer using etchant solutions; step 4, deposit a layer of photoresist onto the patterned Ni and Cr layer—the photoresist preferably being a negative photoresist for high aspect ratio structures; step 5, pattern and develop the resist— preferably by aligning the photoresist mask with the patterns of the patterned Ni and Cr layer; step 6, pyrolyze the photoresist to create the C-MEMs with metal interconnect structure—preferably applying the multi-step pyrolysis process described herein for the fabrication of high aspect ratio carbon structures.

Figure 12:
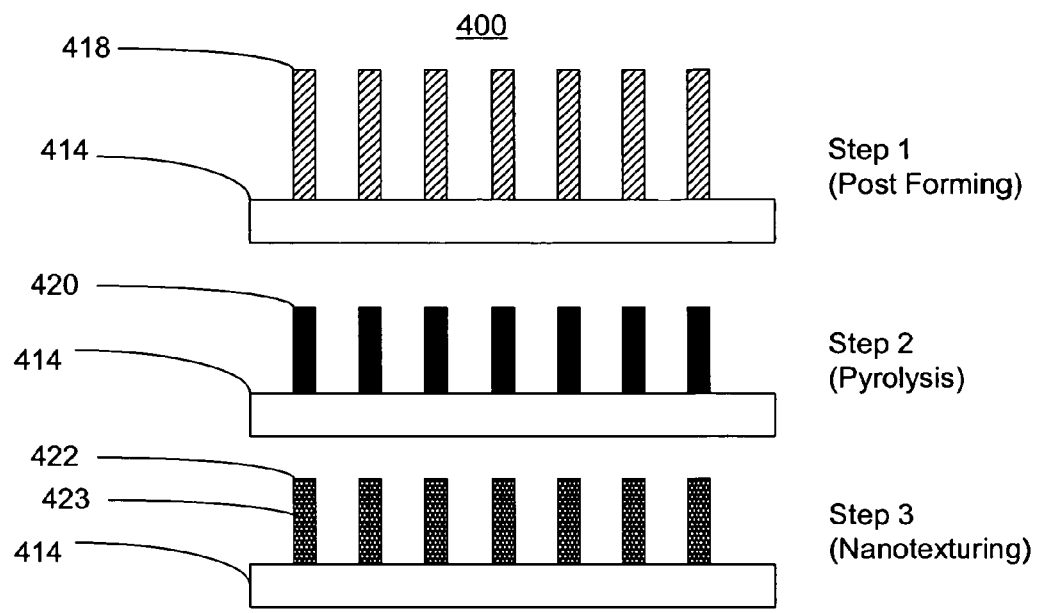
FIG. 12 is a schematic showing the fabrication process for nanotexturing carbon nanostructures.
Figure 13:
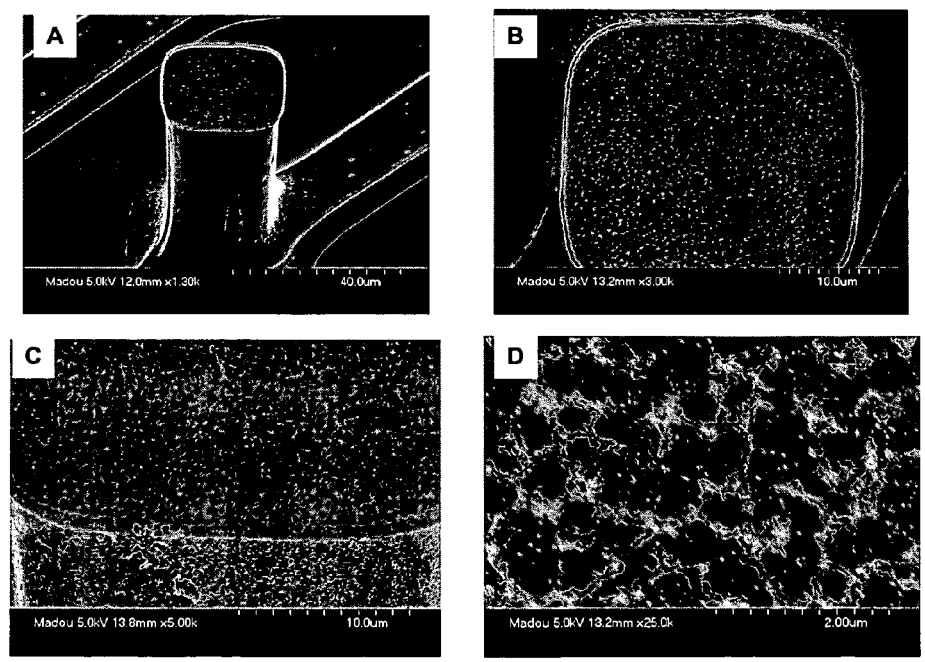
FIG. 13A-D are SEM photographs of a high-aspect-ratio C-MEMS electrode treated in an oxygen plasma.

In many applications where carbon micro-structures act as a transfer interface (e.g. electrodes for battery applications, graft sites for DNA immobilization, sensing electrodes for chemical sensors, etc.), increasing the surface area of the carbon micro-structures is desirable. In one embodiment, as depicted in FIG. 12, the surface of carbon micro-structures are nanotextured to increase the surface area of the carbon micro-structures. Nanotexturing the surfaces of the micro-structures is accomplished through oxygen plasma exposure. The plasma roughens the surface of the microstructure, creating a pumice-like nanotextured surface. This is a simple, yet effective way of increasing surface area and roughness.

Referring to FIG. 12, the steps of the process 400 include forming C-MEMS structures preferably by patterning carbon precursor polymer posts 418 on a substrate 414 at step 1, and then pyrolysing the polymer at step 2 to form carbon posts 422. The carbon precursor polymer posts 418 are preferably photopatterned photoresist and, more preferably, photopatterned negative photoresist such as SU-8 and the like. The carbon posts 422 are preferably formed in a two or multi-step pyrolysis process as described above in regard to FIGS. 1A, 1B and 3. Next, at step 3, the carbon posts 420 are treated in an oxygen plasma to form carbon posts 422 with a nanotextured surface 423. As depicted, the oxygen plasma treatment of step 3 occurs after pyrolysis of the patterned photoresist. Alternatively, the photoresist can be plasma treated before pyrolysis to achieve a nanotextured surface. Whether post or prior to pyrolysis, the oxygen plasma creates reactive oxygen ions that causes combustion of combustible species. Some portions of the whole structure are weaker to this degradation than other portions, causing some portions to be selectively etched. The increase in surface roughness increases the number of triple points or triple phase boundaries, making the devices more sensitive and efficient.

FIGS. 13A through 13D are SEM photographs (at different magnifications) of a sample C-MEMS structure treated in an oxygen plasma. In treating this structure, RF plasma was used at 250 W with an oxygen pressure of 200 mT for 5 minutes to achieve the results shown in FIGS. 13A~13D.

In another embodiment, as depicted in FIGS. 14 through 18, carbon micro-structures are covered with a rich coat of nanoscale structures that hugely increase the surface area of the microstructures. For Li ion microbattery applications, the integration of nanoscale structures such as carbon nanotubes and Si nanowires on C-MEMS electrodes will increase the electrode surface areas and, thus, increase Li storage capacity and power density, and decrease battery charge/discharge rates. For example, single wall carbon nanotubes (SWNT) reversibly intercalate Li up to a ratio of $Li_{2.7}C_6$. This storage capacity is higher than so-called graphite intercalation compound (GIC), $LiC_6$. The graphitic nature of the nanofibrous material and the multi-wall carbon nanotubes (MWNTs) will enhance the Li+ storage capacity compared to the C-MEMS posts alone. C-MEMS can also act as electrical contact and current collectors for C-MEMS/CNTs arrays.

Nanoscale structures can be integrated to C-MEMS structures by catalytic growth or self assembly methods. Different catalyst and gas sources can be used to grow various types of nanofibers (silicon, carbon, etc.) at the surface of the C-MEMS micro-structures. Carbon nanotubes advantageously can be grown at specific locations on the surface C-MEMS micro-structures and in specific directions, at relatively low temperatures by chemical vapor deposition (CVD) techniques. As a result, in addition to increasing the surface area of carbon microstructures, nano-scale structures such as nanotubes, enable C-MEMS to act as an electrical bridge between micro and millimeter scale electronic systems to nanometer scale electronic systems such as carbon nanotube based nanoelectronics. C-MEMS structures can be used as both support and electrical contact to nanoscale materials. The carbon-to-carbon contact is considered to be an ideal electrical contact with negligible contact resistance.

Figure 14:
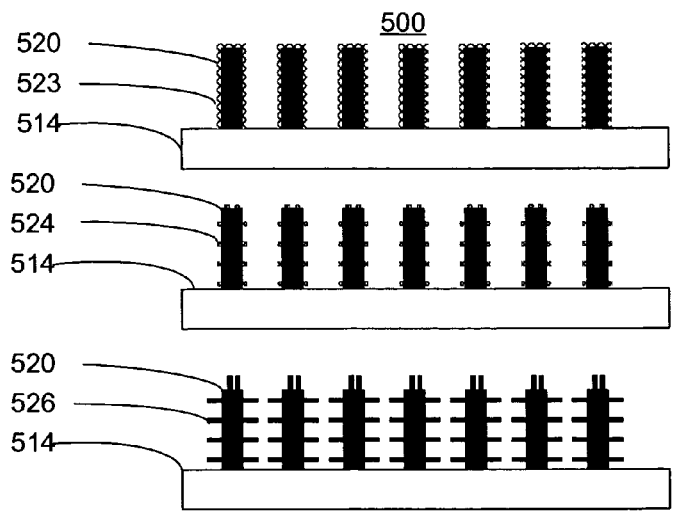
FIG. 14 is a schematic showing the fabrication process for growing nanostructures on carbon micro-structures.

Referring to FIG. 14, a first process 500 includes, at step 1, coating C-MEMS structures 520 arrayed on a substrate 514 with a thin film or coating of a catalyst 523. For example, catalyst particles are suspended in a colloid solution that is coated on the carbon structures. The liquid is then evaporated, at step 2, with the catalyst particles remaining on the carbon structures. If desired, the catalyst film or coating 523 could be patterned at step 2 by patterning techniques such as laser-assisted chemical vapor deposition, lift-off, etching, and the like, resulting in a patterned film 524. Next, at step 3, the sample or wafer is exposed to a hydrocarbon gas such as methane and the like at temperatures sufficiently high to induce carbon nanostructure growth to form nanotubes 526, nanowires, nanofibers and the like, on the C-MEMS carbon structures 520.

The C-MEMS carbon structures 520 can be formed by patterning photoresist, preferably a negative photoresist, such as SU-8, by photolithography, as discussed above and, then pyrolyzing the photoresist in an inert environment at high temperatures (e.g., >600° C.). The pyrolysis process preferably includes the two or multi-step process discussed above. As understood by one of skill in the art, the process 500 could be used to grow carbon nanostructures onto various C-MEMS structures and also other types of wires and fibers (silicon, etc.) depending on the catalyst and gaseous environment used for nanoscale structure growth.

The process 500 depicted in FIG. 14, like conventional methods for carbon nanostructure growth, requires the presence of a gaseous source as the source for material growth. As discussed in regards to FIGS. 15, 16 and 19, an alternative process is provided for producing nanostructures such as nanofibers, tubes, wires and the like, from a source of matter (i.e. carbon) that is essentially in the solid phase and is part of the supporting microstructure. This integrated method allows for selective growth on supporting microstructures such as photolithgraphically defined C-MEMS structures.

Preferably, the C-MEMS structures are microfabricated by photolithographically patterning photoresist. The C-MEMS structures are then exposed to high temperatures in an inert or reducing environment (forming gas), that favors the pyrolis of the photoresist into carbon structures as well as the growth of nanoscale structures such as nanofibers, wires, tubes and the like on the carbon structures. When growing carbon nanostructures, the carbon micro-structures are used as both a mechanical support as well as the source of material for the growth of the carbon nanostructures during exposure to high temperature. Although the source of carbon comes from the photoresist that is used to form the carbon MEMS (C-MEMS) structures during the pyrolysis step, external sources of carbon (gas) could also be used to further enhance the growth process for growth of nanostructures.

Figure 15:
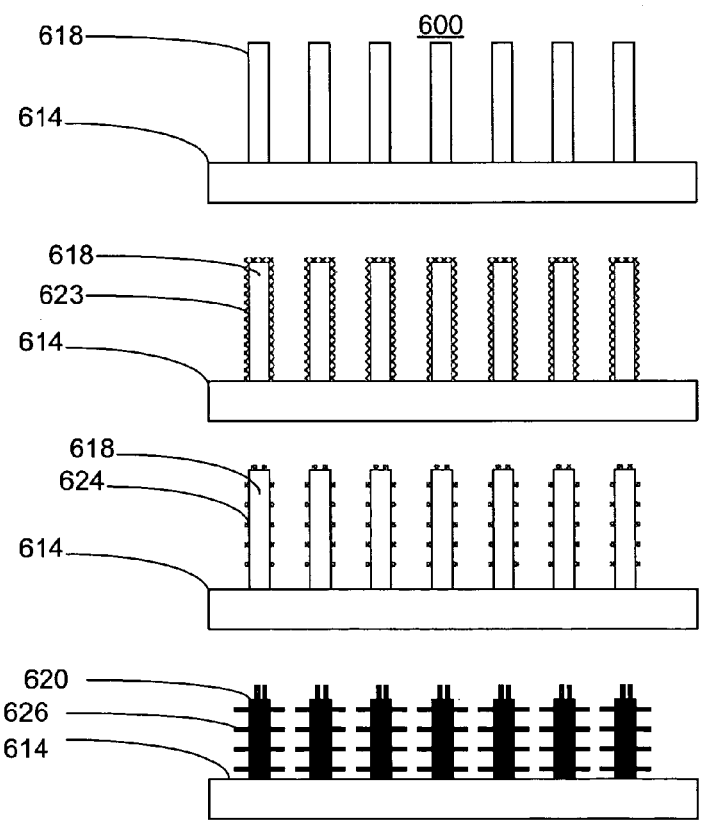
FIG. 15 is a schematic showing the fabrication process for growing nanostructures on carbon micro-structures during a pyrolysis process.

Referring to FIG. 15, the process 600 includes first forming, at step 1, carbon precursor structures 618 such as posts, which can be patterned from photoresist as described above to produce high aspect ratio posts. The posts 618, which are arrayed on a substrate 614, are then coated, at step 2, with a thin film of catalyst 623. For example, catalyst particles are suspended in a colloid solution that is coated on the posts 618. The liquid is then evaporated, at step 3, with the catalyst particles remaining on the posts 618. If desired, the catalyst film or coating 623 could be patterned at step 3 by patterning techniques such as laser-assisted chemical vapor deposition, lift-off, etching, and the like, to form a patterned film 624. Next, at step 4, the sample or wafer is subjected to a pyrolysis process, preferably a two or multi step process as described above. During this process, the photoresist posts are being pyrolysed, which causes the release of carbon containing gases into the pyrolysis furnace atmosphere while transforming the photoresist posts 618 into carbon posts 620. At the same time, these carbon containing gases find their way to the catalyst particles inducing growth of nano-scale structures such a cabon nanotubes 626 extending from the carbon posts 620. This pyrolysis step is an example of a localized chemical vapor deposition process for fabricating carbon nanostructures on C-MEMS.

In an alternative process 700, as depicted in FIG. 16, the carbon precursor micro-structures 718 are microfabricated in an array on a substrate 714 at step 1 using either embedded catalyst nanoparticles 717 or embedded seed nanofibers as part of the carbon precursor microstructures 718. Preferably, the nanoparticles or nanofibers are part of a photodefinable polymer (photoresist) mixture. Next, at step 2, the sample or wafer is subjected to a pyrolysis process, preferably a two or multi step process as described above. During this process, the carbon precursor posts 718 are pyrolysed, which causes the release of carbon containing gases into the pyrolysis furnace atmosphere while transforming the posts 718 into carbon posts 720. At the same time, these carbon containing gases find their way to the catalyst particles or seed nanofibers inducing growth of nanofibers 727 on the carbon posts 720.

The elegance of this method is the use of the photoresist as a matrix to hold the catalyst of any nanofiber (silicon, nickel, carbon, etc.) that would initiate fiber growth during the pyrolysis step and act as the carbon source during nanofiber growth. In order to grow nanofibers or nanotubes on the carbon microposts, the photoresist is preferably doped with either catalyst nanoparticles or a small amount of seed nanofibrous material (<1% in weight) that still contains catalyst nanoparticles at their tips. The doping is usually done by premixing the dopant with the photoresist before the photoresist spinning step. The doping can also be done as a stamping step after the photoresist has been patterned. Catalysts for various nanofibrous materials (nickel, iron, cobalt, copper and the like) can be added in order to grow any type of nanofibers at the surface of the C-MEMS structure. As an example, nickel, silicon and carbon nanofibers can be fabricated using that technique.

The following provides an example of the process steps for growing carbon nanofibers on C-MEMS posts.

Photoresist doping: SU-8 100 negative photoresist is mixed together with carbon nanofibers at a 0.2% mass ratio. The stirring is continued until a uniform mixture is obtained. The mixture is allowed to sit for 24 hours in order to allow the evacuation of the bubbles generated by the mixing process.

Photoresist spinning: Doped SU8 is spun onto a silicon wafer using a laurel photoresist spinner at 2000 rpm for 30 seconds leaving a thickness of about 100 um.

Softbake: A two step soft bake process is done in a baking oven (10 minutes at 65° C. and 40 minutes at 95° C.) in order to evaporate the solvent in the photoresist.

Exposure: The sample is allowed to cool and then is exposed through a mask to a 1000 mJ dose of UV light (365 nm).

Post exposure bake: A two step post exposure bake process is done in a baking oven (1 minute at 65° C. and 12 minutes at 95° C.) in order to promote crosslinking of the exposed photoresist.

Development: The sample is allowed to cool down to room temperature and then put in an SU8 developer solution.

After the development process, parts of the nanofibers used to dope the photoresist stick out from the side surface of the C-MEMS post structures as shown in FIG. 17. These fibers shown in FIG. 17 still contain catalyst particles at their tips (i.e., iron).

Pyrolysis and carbon nanofibers growth: An initial heating step at 300° C. is first used in order to cure the photoresist and ensure good adhesion between the C-MEMS posts and the substrate. During that time an inert environment is insured by a constant flow of nitrogen in the furnace chamber. This step is followed by a high temperature ramp up to 900° C. in a forming gas environment (5% hydrogen and 95% nitrogen). The sample is then left for 1 hour at this temperature during which two mechanisms are active. First the photoresist is being pyrolysed thus releasing carbon containing gases into the furnace atmosphere while transforming the photoresist posts into carbon. At the same time, these carbon containing gases find their way to the seed carbon nanofibers and allow further growth of these fibers enhanced by the presence of the catalyst at their tip.

The resulting nanofibrous structures after pyrolysis of the structure shown in FIG. 17 are shown in FIG. 18A and FIG. 18B. FIG. 18A is a SEM photo of a nanofibrous C-MEMS 100 microns high post. FIG. 18B is a close up view of the surface revealing the carbon nanofibres structures (100 nm in diameter).

The method can be generalized to grow other types of nanofibrous materials onto carbon micro-structures. When fabricating other types of nanofibers (silicon, nickel, etc.) the proper gas should be introduced (e.g., Silane for silicon nanofiber) in order for the nanofibers to grow. Several types of nanofibers can be obtained at the same time if different dopants are mixed with the photoresist at the same time and the proper growth gases are introduced during the pyrolysis step.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit of the attached claims. Furthermore, it should also be understood that the features or characteristics of any embodiment described or depicted herein can be combined, mixed or exchanged with any other embodiment.

What is claimed:

1. A localized chemical vapor deposition process for the growth of carbon nanostructures extending from carbon micro-structures of a C-MEMS devices, comprising the steps of forming carbon precursor micro-structures, pyrolyzing the carbon precursor micro-structures, exposing catalysts at the surface of the micro-structures to carbon gases generated from outgassing carbon gas from the carbon precursor micro-structures during pyrolysis, and growing carbon nano-structures from the catalyst site at the surface of the carbon micro-structures.

2. The process of claim 1 wherein the carbon precursor micro-structures are coated with a film comprising a catalyst.

3. The process of claim 1 wherein catalyst nano-particles are embedded in the carbon precursor micro-structures.

4. The process of claim 1 wherein nano-fibers with catalyst tips are embedded in the carbon precursor micro-structures.

5. The process of claim 1 wherein the step of forming the pre-cursor carbon micro-structures includes the step of photolithographically patterning photoresist material.

6. The process of claim 5 wherein the photoresist is a negative photoresist.

7. The process of claim 1 wherein the pyrolyzing step is a multi-step process.

* * * * *